(12) United States Patent
He

(10) Patent No.: US 8,405,467 B2
(45) Date of Patent: Mar. 26, 2013

(54) METHODS AND APPARATUSES FOR INDUCTOR TUNING IN RADIO FREQUENCY INTEGRATED CIRCUITS

(75) Inventor: Allen Nan He, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/945,892

(22) Filed: Nov. 27, 2007

(65) Prior Publication Data

US 2009/0134949 A1  May 28, 2009

(51) Int. Cl.
H03H 7/38 (2006.01)
(52) U.S. Cl. .......................................... 333/32; 333/17.3
(58) Field of Classification Search .................... 333/32, 333/33, 17.3
See application file for complete search history.

(56) References Cited

U.S. PATENT DOCUMENTS

| | | | |
|---|---|---|---|
| 4,890,180 A | 12/1989 | Paulsson | |
| 5,654,679 A | 8/1997 | Mavretic et al. | |
| 6,356,149 B1 | 3/2002 | Stengel et al. | |
| 6,426,683 B1 | 7/2002 | Gu et al. | |
| 6,549,096 B2 | 4/2003 | Groves et al. | |
| 6,556,416 B2 | 4/2003 | Kunihiro | |
| 6,882,245 B2* | 4/2005 | Utsunomiya et al. | 333/174 |
| 6,907,231 B2 | 6/2005 | Bhatti | |
| 6,940,358 B1 | 9/2005 | Meacham | |
| 7,107,026 B2 | 9/2006 | Pinks | |
| 2004/0240126 A1 | 12/2004 | Tiemeijer | |
| 2004/0251984 A1* | 12/2004 | Javor | 333/32 |
| 2005/0130608 A1 | 6/2005 | Forse et al. | |
| 2008/0079513 A1* | 4/2008 | Prikhodko et al. | 333/175 |
| 2008/0258836 A1 | 10/2008 | Kim et al. | |

FOREIGN PATENT DOCUMENTS

| | | |
|---|---|---|
| CN | 1965475 A | 5/2007 |
| EP | 1729412 A1 | 12/2006 |
| GB | 1271441 | 4/1972 |
| JP | 6053770 A | 2/1994 |
| JP | 7086851 A | 3/1995 |
| JP | 9292925 A | 11/1997 |
| JP | 2001185990 A | 7/2001 |

(Continued)

OTHER PUBLICATIONS

Durham A M et al: "Circuit Architectures for High Linearity Monolithic Continuous-Time Filtering", IEEE Transactions on Circuits and Systems II: Express Briefs, IEEE Service Center, New York, NY, US, vol. 39, No. 9, Sep. 1, 1992, pp. 651-657, XP000360386, ISSN: 1057-7130, DOI: DOI:10.1109/82.193320.

(Continued)

*Primary Examiner* — Stephen Jones
(74) *Attorney, Agent, or Firm* — Kevin T. Cheatham

(57) ABSTRACT

An apparatus for matching impedance within a Radio Frequency (RF) integrated circuit is presented. The apparatus includes a first impedance element placed in an RF signal path, an first inductor fabricated on the integrated circuit and connected to the first impedance element, and an adjustable capacitance circuit connected in series with the first inductor and placed between the first inductor and a ground node, where the adjustable capacitance circuit is adjusted to tune the inductance of the first inductor. A method for tuning an inductor is presented. The method includes ascertaining a target inductance value for an inductor in a RF integrated circuit, and determining a capacitance value of an adjustable capacitance circuit so that, when coupled to the inductor, the combined impedance of the adjustable capacitance circuit and the inductor is tuned to the ascertained target inductance value.

23 Claims, 5 Drawing Sheets

FOREIGN PATENT DOCUMENTS

| | | | |
|---|---|---|---|
| JP | 2005286853 | A | 10/2005 |
| JP | 2006038520 | A | 2/2006 |
| KR | 20080094155 | A | 10/2008 |

OTHER PUBLICATIONS

International Search Report and Written Opinion—PCT/US2008/084772, International Search Authority—European Patent Office—Feb. 6, 2009.

Michael Roland et al: "Automatic impedance matching for 13.56 MHz NFC antennas", Communication Systems, Networks and Digital Signal Processing, 2008. CNSDSP 2008. 6th International Symposium on, IEEE, Piscataway, NJ, USA, Jul. 25, 2008, pp. 288-291, XP031314771, ISBN: 978-1-4244-1875-6.

Taiwan Search Report—TW097146018—TIPO—Mar. 1, 2012.

* cited by examiner

METHODS AND APPARATUSES FOR INDUCTOR TUNING IN RADIO FREQUENCY INTEGRATED CIRCUITS

FIELD OF DISCLOSURE

The embodiments of the disclosure relate generally to impedance matching circuits, and more specifically, circuits capable of tuning an inductor within a Radio Frequency (RF) impedance matching integrated circuit (IC).

BACKGROUND

Radio Frequency Integrated Circuit (RFIC) networks can utilize impedance matching circuits to interface different sub-sections within the RFIC network. The impedance matching circuits may be used to improve power transfer between network sub-sections, and/or mitigate signal reflections occurring between the sub-sections' electrical boundaries. Fabricating the impedance matching circuits directly on the RFIC substrate itself may be beneficial for driving cost reduction and improving packaging efficiency.

Tuning matching networks to improve performance can present challenges to the circuit designer. Because parameters of the various circuit elements (e.g., inductors, capacitors, etc.) depend upon many factors, performance of the impedance matching circuit can be difficult to predict. Conventionally, in order to achieve sufficient accuracy for impedance matching, tuning the impedance matching networks may utilize iterative, trial-and-error techniques. One conventional approach may involve making an initial guess with a particular on-chip circuit element, then measuring the result to determine the circuit's effectiveness. If the circuit's performance is unsatisfactory, a circuit element in the impedance matching circuit can be substituted with another having a different value. This process may be repeated unit the RF network performs adequately.

The substitution of the circuit element may be performed by physically removing the old circuit element and replacing it with a new one. However, this approach may not be the most practical as circuit elements placed on the die of the integrated circuit can be difficult to physically replace. Physical replacement of the circuit elements may involve costly metal spins of the integrated circuit. Metal spins are additional tapeouts (e.g., sending the design to manufacturing) wherein the metal layers of the circuit are altered, but the silicon layers are left unchanged.

A more cost effective approach may involve placing/fabricating a plurality of circuit elements (i.e., a "bank" of circuit elements) on the integrated circuit, and selecting one or more circuit elements from the plurality to determine which provides the best performance.

Impedance matching circuits commonly utilize inductors to achieve a resonance effect at a desired frequency. It therefore may be desirable to alter the inductance value of the inductor in order to tune the impedance matching circuit. However, inductors fabricated using integrated circuit techniques can occupy a significant amount of space on the integrated circuit die (e.g., typically 300 um by 300 um or more). Therefore, it may be impractical to implement an inductor bank for altering an inductor value to facilitate the tuning of the impedance matching circuit.

Accordingly, there is a need for RFIC impedance matching circuits which may be easily and economically tuned for improved performance.

SUMMARY

An embodiment of the invention can include an apparatus for matching impedance within a Radio Frequency (RF) integrated circuit. The apparatus includes a first impedance element placed in an RF signal path, an first inductor fabricated on the integrated circuit and connected to the first impedance element, and an adjustable capacitance circuit connected in series with the first inductor and placed between the first inductor and a ground node, where the adjustable capacitance circuit is adjusted to tune the inductance of the first inductor.

Another embodiment of the invention can include a method for tuning an inductor is presented. The method includes ascertaining a target inductance value for an inductor in a RF integrated circuit, and determining a capacitance value of an adjustable capacitance circuit so that, when coupled to the inductor, the combined impedance of the adjustable capacitance circuit and the inductor is tuned to the ascertained target inductance value.

Another embodiment of the invention can include an apparatus for tuning an inductor. The apparatus includes a means for adjusting a capacitance value of an adjustable capacitance circuit so that, when coupled to the inductor, the combined impedance of the adjustable capacitance circuit and the inductor is tuned to a target inductance value for an inductor in a Radio Frequency (RF) integrated circuit.

Another embodiment of the invention can include an apparatus for tuning an inductor within a matching circuit. The apparatus compising: a first impedance element placed in an RF signal path; a first inductor fabricated on the integrated circuit and connected to the first impedance element; and an adjustable capacitance circuit connected in series with the first inductor and placed between the first inductor and a ground node, wherein the adjustable capacitance circuit is adjusted to tune the inductance of the first inductor, and wherein the adjustable capacitance circuit comprises a controller having logic configured to adjust a capacitance value so that the combined impedance of the adjustable capacitance circuit and the inductor is tuned to a target inductance value for an inductor in a Radio Frequency (RF) integrated circuit.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Figure 1:
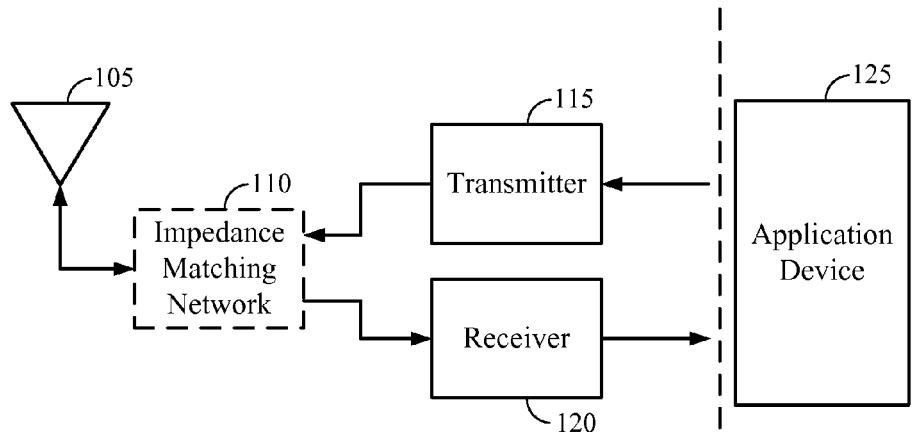
FIG. 1 is a block diagram depicting an exemplary transmitter and receiver using an impedance matching network.

FIG. 1 is a block diagram depicting an exemplary transceiver 100 using an impedance matching device consistent with various embodiments of the invention. The transceiver may include an antenna 105, an impedance matching network 110, a transmitter 115, and/or a receiver 120. An application device 125 may interface with the transceiver 100 to provide and/or acquire signals. When the transceiver 100 is operating in a transmit mode, signals provided by the application device 125 may initially be modulated and/or amplified by the transmitter 115. After modulation and/or amplification, the signals may pass through the impedance matching network 110, and then be radiated into the atmosphere as an electromagnetic wave by the antenna 105. During a receiving mode of operation, signals radiating in the atmosphere may impinge upon the antenna to generate a received signal. The received signal may pass through the impedance matching network 110, and then go on to the receiver 120, where it may be amplified and/or demodulated. After amplification and/or demodulation, signal may then be provided to the application device 125 for various uses.

The impedance matching network 110 may be used to improve power transfer between the transmitter 115/receiver 120 and the antenna 105, and also may mitigate signal reflections occurring between these sub-systems to improve the amplitude and/or phase characteristics of the signal. The impedance matching network 110 may contain one or more impedance matching circuits. In some embodiments, the transmitter 115 and receiver may share the same circuit in the impedance matching network 110. In other applications, there may be separate impedance matching circuits specific to the transmitter 115 and to the receiver 120. The matching network may have specific frequency domain characteristics which can be altered by tuning circuit elements therein to improve the performance of the impedance matching network 110. Details regarding such tuning will be presented below in the description of FIG. 2.

The transceiver 100 may be used in any RF application, including Bluetooth® transceivers, such as, for example, Qualcomm's BTS4000 series. Such transceivers may be used in, for example, hand-free kits for cellular phones. Other applications may include IEEE 802.11x (Wi-Fi) networks operating in the GHz frequency range (e.g., 2.4 GHz). The transceiver 100 may also utilize separate antennas for either the transmitter or the receiver. In some applications, the transceiver may only include either a transmitter or receiver.

The application device 125 may be any type of analog and/or digital device, and further could be an information processing, networking and/or any other type of communication device. Such devices may include, but are not limited to, a computer, a cellular handset, a personal digital assistant, a portable music device, a headset and/or other audio device, etc.

FIG. 1 illustrates only one exemplary use of an impedance matching network 110. It should be appreciated that the impedance matching network 110 may be used a wide variety of other electronic applications, and is not limited for use in only transceivers, transmitters, and/or receivers. Also, as shown in FIG. 1, the impedance matching network may not be coupled to an antenna 105, but may be a cable, waveguide, etc. providing an RF signal.

Figure 2:
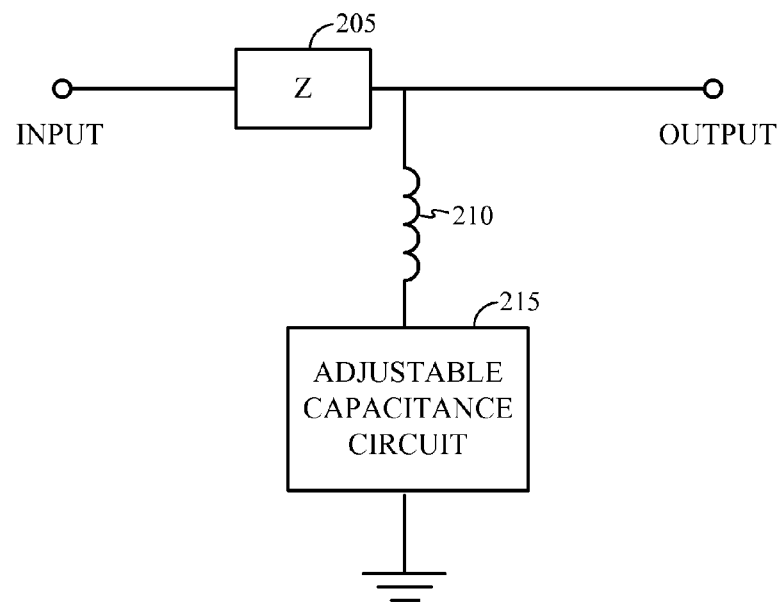
FIG. 2 is a schematic diagram of an exemplary impedance matching circuit having a tunable inductor.

FIG. 2 is a schematic diagram of an exemplary impedance matching circuit 200 which may be included in the impedance matching network 110. The impedance matching circuit 200 may have an impedance 205 placed in the signal path between the input and output ports of the impedance matching circuit 200. In the embodiment shown in FIG. 2, an inductor 210 may be coupled to the impedance 205 on the output side of the impedance matching circuit 200 (other embodiments, as shown below, may allow for different configurations). In series with the inductor 210 may be an adjustable capacitance circuit 215. The other node of the adjustable capacitance circuit 215 may in turn be coupled to ground.

Because the adjustable capacitance circuit 215 is in series with the inductor 210, their combined impedance may be thought of as an effective inductance $L_{eff}$, which may be expressed as:

$$L_{eff} = L - \frac{1}{\omega^2 C_{eff}},$$

where
  $L_{eff}$: effective inductance of inductor L 210;
  L: actual inductance of inductor L 210;
  $\omega$: radian frequency of signal; and
  $C_{eff}$: effective capacitance of adjustable capacitance network 215.

As can be seen from the above equation, the effective capacitance $C_{eff}$ partially cancels the inductance of inductor 210. Therefore, by changing the effective capacitance $C_{eff}$ of the adjustable capacitance circuit 215, the effective inductance of $L_{eff}$ may be changed, thereby allowing the tuning of the inductor 210 for improving the performance of the impedance matching circuit 200. Moreover, altering $L_{eff}$ can result in precisely controlled changes in the resonant frequency of the impedance matching circuit 200. Note that the impedance matching circuit 200 may not use an adjustable impedance 205 for tuning because it is in the direct signal path. Having a tunable element in the direct signal path may detrimentally affect the noise figure of the circuit.

The impedance 205 may be any type of known circuit element, such as, for example, a capacitor, an inductor, and/or a resistor. Moreover, impedance 205 may be a plurality of such circuit elements in any known configuration. Additionally, impedance 205 is not restricted to passive elements, and may include active elements which may be used to realize various forms of impedance values (e.g., configurations of transistors, amplifiers in conjunction with other passive circuit elements). The inductor 210 may any type of passive inductor, or may be a combination of active and passive elements configured to simulate an inductor (e.g., a gyrator).

The adjustable capacitance circuit 215 may be any type of adjustable capacitor device. Moreover, as will be described below, the adjustable capacitor circuit can be implemented utilizing a plurality of capacitors, each controlled by switches, to generate a desired capacitance value. The switches may be active elements such as transistors (e.g., any type of metallic oxide semiconductor, such as n-type (NMOS) and/or p-type (PMOS)), which may be operated by a controller (e.g., a microprocessor) based upon software command. Such an arrangement would allow for the tuning of the adjustable capacitance circuit shortly after fabrication, and anytime thereafter, which may be useful for compensation of components for long-term drift. Alternatively, the switches may be realized as devices having states which may be set one time only, and not altered thereafter (e.g., fuse-type arrangement which may be coupled or decoupled (blown) to set the switch configuration). Having switches which may be set one time only, so that the device is only calibrated once, may be more cost-effective due to simplicity, but may lack long term flexibility since adjustments cannot be made thereafter.

The impedance matching 200 may be fabricated on a die of an integrated circuit, and the circuit elements therein may be realized using IC fabrication techniques. For example, capacitors, inductors, resistors, and switches (e.g., transistors) may be fabricated by photolithography or other types of etching/implantation techniques. Photolithography may include operations used to generate the pattern on the wafer that define the devices on a particular layer, such as silicon layer, and metal layers (e.g., up to 10). Implantation may include operations to define the active devices on a silicon layer (e.g., transistors). Etching includes operations that may be used for removing the photo mask or silicon or metal materials, and to carve the shape of the device and interconnections. Deposition includes operations which may be used for depositing metals to form interconnections such as the wire on a single layer, or vias for connections between layers. Using various IC fabrication techniques, inductors may be fabricated from materials which include metal wire.

Figure 3A:
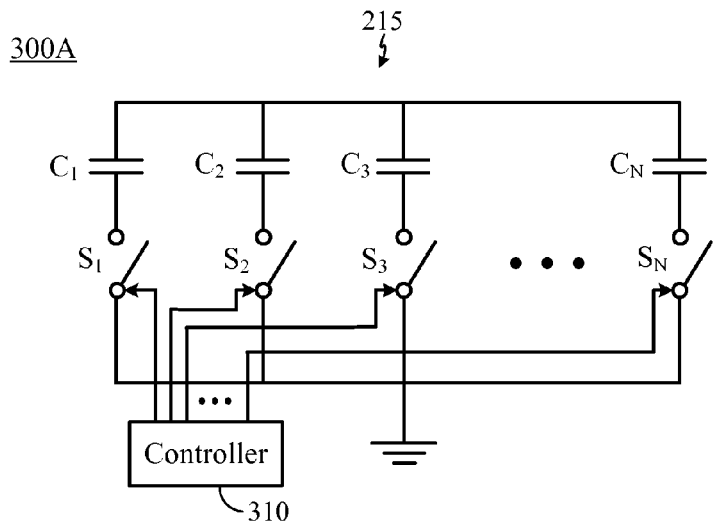
FIGS. 3A, 3B, and 3C are schematic diagrams of exemplary adjustable capacitance circuits.
Figure 3B:
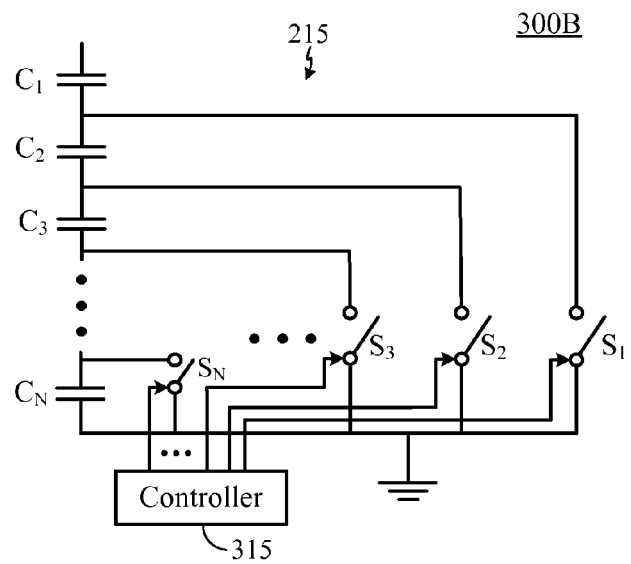
Figure 3C:
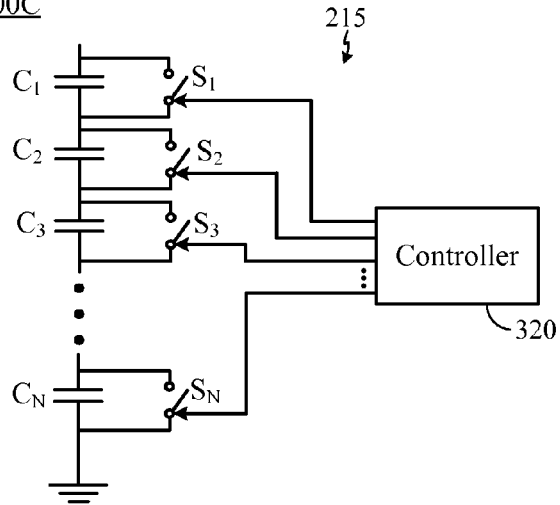

FIG. 3A-3C are schematic diagrams of exemplary circuits for realizing the adjustable capacitance circuit 215. FIG. 3A shows an adjustable capacitance circuit 300A having a plurality of capacitors $C_1, C_2, \ldots, C_N$ which may be configured in a parallel arrangements using switches $S_1, S_2, \ldots, S_N$. Each capacitor, $C_X$, has a corresponding switch, $S_X$, connected in series, to form a switched capacitor. The plurality of capacitors $C_1, C_2, \ldots, C_N$ and switches $S_1, S_2, \ldots, S_N$ form a switched capacitor array. Each of the switches $S_1, S_2, \ldots, S_N$ may be controlled by a controller 310 in order to produce a particular effective capacitance value $C_{eff}$. In this arrangement, $C_{eff}$ may be expressed by the following equation:

$$C_{eff} = \sum_{i=1}^{N} s_i C_i,$$

where: $s_i=1$ if switch $s_i$ is on, and $s_i=0$ if switch $s_i$ is off.

FIG. 3B shows another exemplary realization for adjustable capacitor circuit 215 having a plurality of capacitors $C_1, C_2, \ldots, C_N$ which may be configured in a series arrangement using switches $S_1, S_2, \ldots, S_N$. Each switch is in a parallel arrangement with one or more capacitors. The number of capacitors which are connected in series depends upon the configuration of switches $S_1, S_2, \ldots, S_N$. Each of the switches $S_1, S_2, \ldots, S_N$ may be controlled by a controller 315 in order to produce a particular effective capacitance value $C_{eff}$. In this arrangement, $C_{eff}$ may be expressed by the following equation:

$$C_{eff} \begin{cases} C_1 & \text{if } J=1 \\ \dfrac{1}{\dfrac{1}{C_1} + \sum_{i=2}^{J} \dfrac{1}{C_i}} & \text{if } 1 < J \le N, \end{cases}$$

where:
J may equal the switch number that is the first one from 1 to N that is closed.

FIG. 3C shows another exemplary realization for adjustable capacitor circuit 215 having a plurality of capacitors $C_1, C_2, \ldots, C_N$ which may be configured in a series arrangement using switches $S_1, S_2, \ldots, S_N$. Here, each switch is configured in parallel with one capacitor. The number of capacitors which are connected in series depends upon the configuration of switches $S_1, S_2, \ldots, S_N$. Each of the switches $S_1, S_2, \ldots, S_N$ may be controlled by a controller 320 in order to produce a particular effective capacitance value $C_{eff}$. In this arrangement, $C_{eff}$ may be expressed by the following equation:

$$C_{eff} = \dfrac{1}{\sum_{i=1}^{N} \dfrac{1-s_i}{C_i}},$$

where: $s_i=1$ if switch $s_i$ is on, and $s_i=0$ if switch $s_i$ is off.

In any configuration, the adjustable capacitance circuit 215 may be fabricated so that the capacitors $C_1, C_2, \ldots, C_N$ have values which may result in uniform steps when changing $L_{eff}$. This may lead to the capacitors having different values, resulting in capacitor banks and/or ladders having steps which are non-uniform.

Figure 4A:
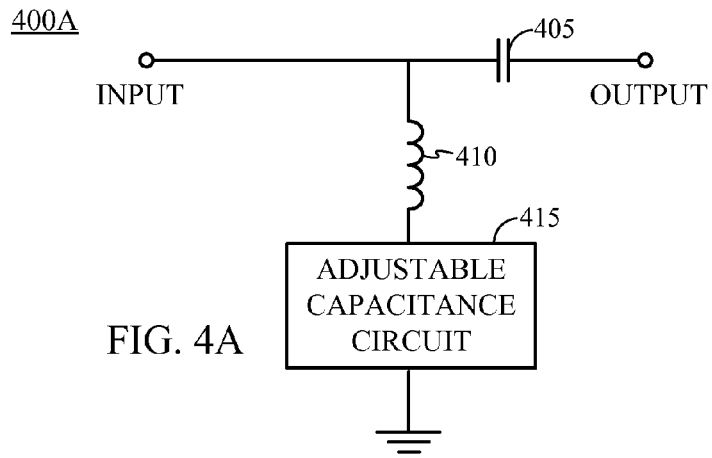
FIGS. 4A, 4B, and 4C are schematic diagrams of various examples of impedance matching circuits.
Figure 4B:
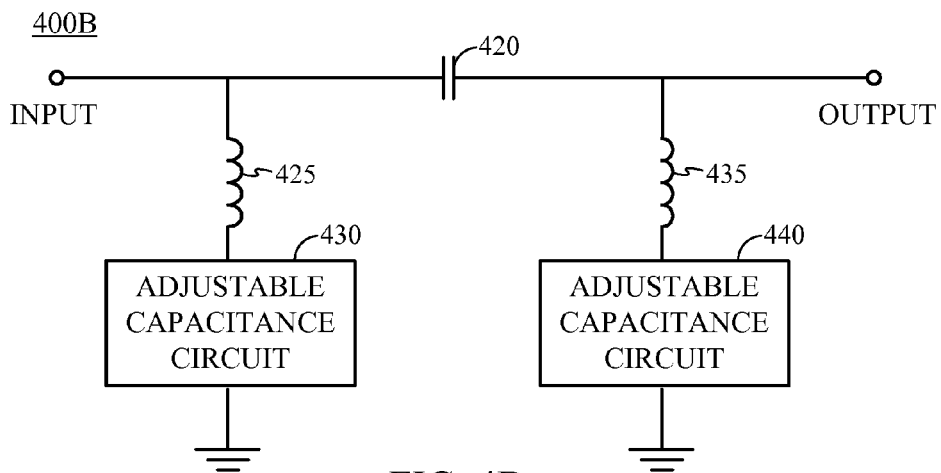
Figure 4C:
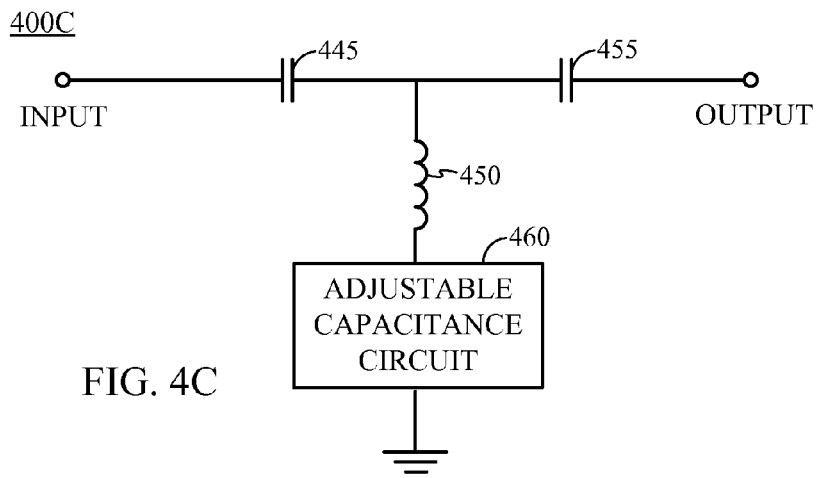

FIGS. 4A, 4B, and 4C are schematic diagrams of various embodiments of impedance matching circuits. FIG. 4A shows an exemplary impedance matching circuit 400A which is a second order, high-pass circuit. Impedance matching circuit 400A includes a capacitor 405 placed in the signal path between the input and output ports. The capacitor 405 may be on the left or right (as shown) side of the inductor, depending on the impedance values of input and output ports. In this embodiment, an inductor 410 may be coupled to the capacitor 405 on the input side of the impedance matching circuit 400A. In series with the inductor 410 may be an adjustable capacitance circuit 415. The other node of the adjustable capacitance circuit 415 may in turn be coupled to ground. In impedance matching circuit 400A, inductor 410 may be tuned by adjustable capacitance circuit 415 in order to adjust the impedance matching circuit 400A. Because capacitor 405 is in the signal path, it may be better to tune inductor 410, which is not in the signal path, in order to minimize the noise figure of the circuit FIG. 4B shows an exemplary impedance matching circuit 400B which is a third order PI matching circuit. Impedance matching circuit 400B includes a capacitor 420 placed in the signal path between the input and output ports. Here, a first inductor 425 may be coupled to the capacitor 420 on the input side of the impedance matching circuit, and a second inductor 435 may be coupled to the capacitor 420 on the output side of circuit 400B. In series with first inductor 425 may be a first adjustable capacitance circuit 430, and in series with second inductor 435 may be a second adjustable capacitance circuit 440. The other node of each adjustable capacitance circuit 430 and 440 may be connected to ground. In this embodiment, impedance matching circuit 400B may tune first inductor 425 and second inductor 435 either independently or in a collaborated manner to achieve the best impedance matching.

FIG. 4C shows an exemplary impedance matching circuit 400C which is a third order T matching circuit. Impedance matching circuit 400C includes a first capacitor 445 and second capacitor 455, both being placed in the signal path between the input and output ports. In this embodiment, an inductor 450 may be coupled to the node joining first capacitor 445 and second capacitor 455. In series with the inductor 450 may be an adjustable capacitance circuit 460. The other node of the adjustable capacitance circuit 460 may be coupled to ground. In impedance matching circuit 400C, inductor 450 may be tuned by adjustable capacitance circuit 460 in order to adjust the impedance matching circuit 400C.

Figure 5:
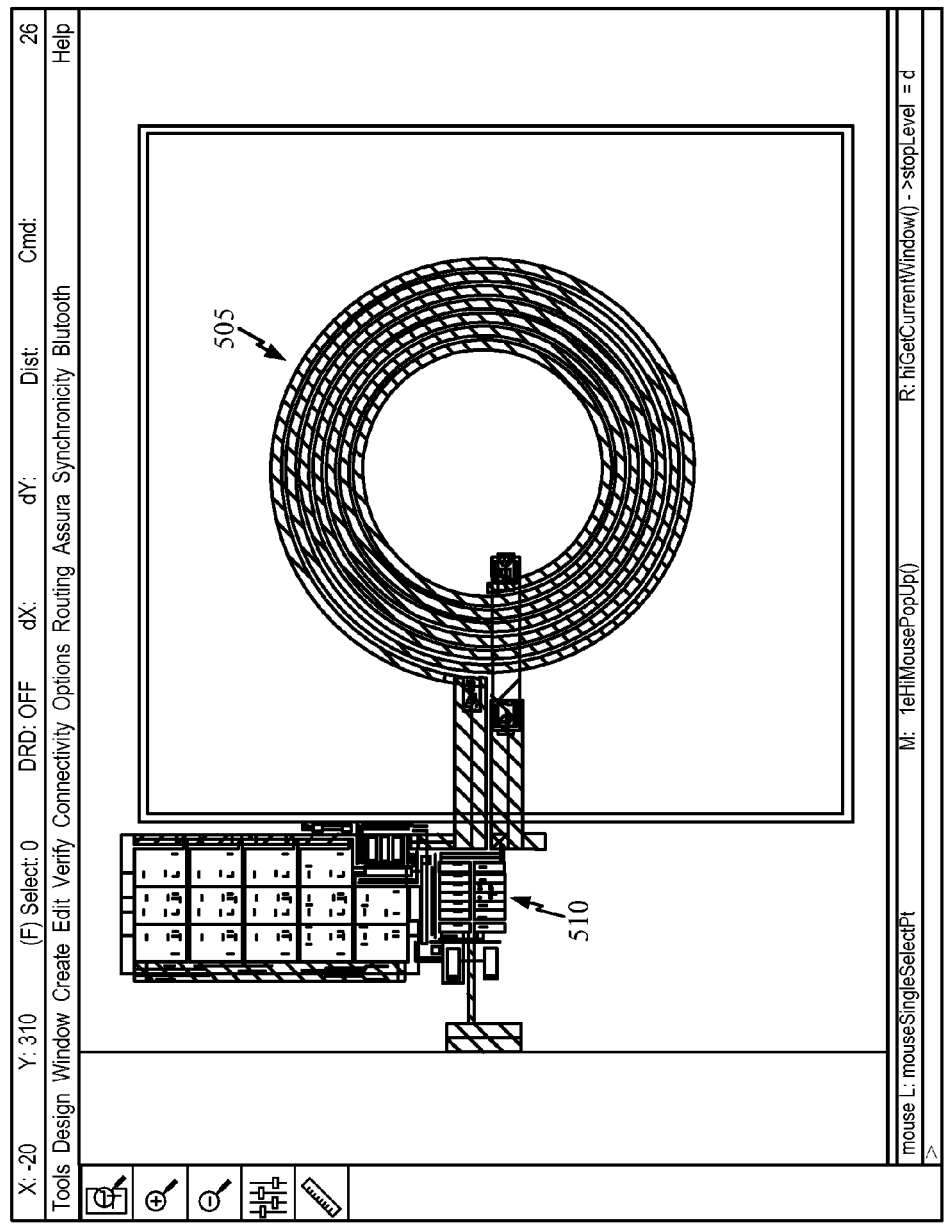
FIG. 5 is diagram of an exemplary inductor and capacitor fabricated using integrated circuit techniques.

FIG. 5 is diagram of an exemplary inductor and capacitor fabricated using integrated circuit techniques which may be consistent with various embodiments of the invention. The inductor 505 may be formed on the die of an integrated circuit by placing a metalized strip in a pattern which may tend to concentrate magnetic flux in order to produce an inductive effect (here, the inductor 505 is realized using spiral pattern). A capacitor element 510 is also shown. Inductor 505 may be formed using lithography, chemical or plasma etching, deposition or metallization, mechanical-chemical polishing, etc., in the formation of the metal layers. As can be seen from the drawing, the inductor 505 uses much more surface area of die than does capacitor 510 (e.g., 300 um×300 um=90000 um$^2$ for the inductor, 505 versus 4 um×10 um=40 um$^2$ for a single capacitor 510). Given that inductors may be so much larger than capacitors, it is more efficient in terms of space to utilized adjustable capacitor arrays instead of an inductor arrays.

Figure 6:
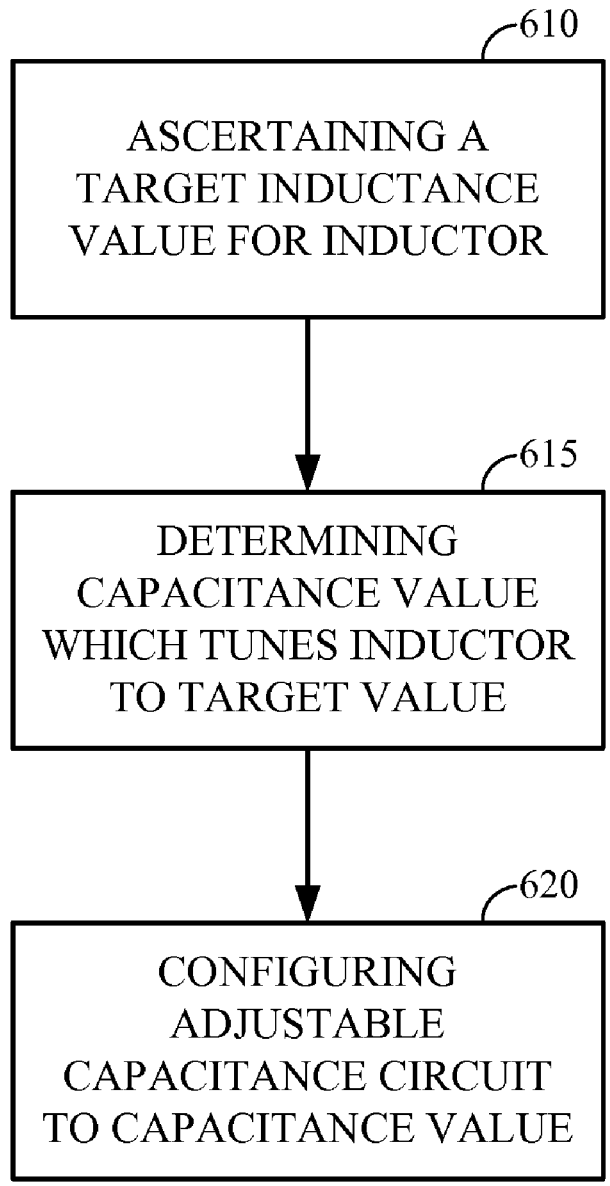
FIG. 6 is a flowchart depicting an exemplary process for tuning an impedance matching circuit.

FIG. 6 is a flowchart depicting an exemplary process 600 for tuning an impedance matching circuit. Initially, a target inductance may be ascertained which will be an appropriate value for tuning the impedance matching circuit (Block 610). The target inductance may be determined by circuit modeling, or by using empirical methods based on circuit designer's experience. Based on the target inductance value, and the expected process error, a tuning range is determined. Then the value of inductor and capacitors are selected to ensure the coverage of the target inductance and tuning range. Next, an effective capacitance value may be determined ($C_{eff}$) for the adjustable capacitance network 215 which will tune inductor 210 to the target inductance value (Block 615). Once the capacitance value is determined, the controller 310/315 may determine one or more switches to activate in order to obtain the proper effective capacitance $C_{eff}$ so that inductor 210 is tuned to the proper effective inductance $L_{eff}$ (Block 615).

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus for matching an impedance within a Radio Frequency (RF) integrated circuit, comprising:
a first impedance element placed in an RF signal path;
a first inductor fabricated on the integrated circuit and connected to the first impedance element; and
an adjustable capacitance circuit connected in series with the first inductor and placed between the first inductor and a ground node in a configuration that calibrates the effective inductance of the first inductor in response to changes of effective capacitance in the adjustable capacitor circuit.

2. The apparatus according to claim 1, wherein the first impedance element comprises a capacitor.

3. The apparatus according to claim 1, wherein the adjustable capacitor circuit is used in the 2.4 GHz frequency range.

4. The apparatus according to claim 1, further comprising:
a second inductor fabricated on the integrated circuit and connected to the first impedance element, wherein the first impedance element is placed between the first and second inductors; and a second adjustable capacitance circuit connected in series with the second inductor and placed between the second inductor and a ground node, wherein the second adjustable capacitance circuit is adjusted to tune the inductance of the second inductor.

5. The apparatus according to claim 1, further comprising:
a second impedance element placed in the RF signal path and connected to the first inductor and the first impedance element.

6. The apparatus according to claim 1, wherein the first inductor comprises a metalized strip formed in a pattern for concentrating a magnetic flux.

7. The apparatus according to claim 6, wherein the metalized strip is formed using a spiral pattern.

8. The apparatus according to claim 1, wherein the adjustable capacitance circuit comprises:
a tunable capacitor array having a plurality of capacitors and switches, wherein each switch is configured such that its on/off state affects the capacitance value of the tunable capacitor array.

9. The apparatus according to claim 8, wherein from the plurality of capacitors and switches, each capacitor is connected in series with a switch to form a switched capacitor, and the plurality of switched capacitors are connected in parallel.

10. The apparatus according to claim 9, wherein the adjustable capacitance is described by the following equation, $$C_{eff} = \sum_{i=1}^{N} s_i C_i,$$

where $s_i$=1 if switch s is on, and $s_i$=0 if switch s is off.

11. The apparatus according to claim 8, wherein from the plurality of capacitors and switches, each switch is connected in parallel with at least one capacitor, and wherein the at least one capacitor is connected in series.

12. The apparatus according to claim 11, wherein the adjustable capacitance is described by the following equation, $$C_{eff} \begin{cases} C_1 & \text{if } J = 1 \\ \dfrac{1}{\dfrac{1}{C_1} + \sum_{i=2}^{J} \dfrac{1}{C_i}} & \text{if } 1 < J \leq N, \end{cases}$$

where J equals the switch number that is the first one from 1 to N that is closed.

13. The apparatus according to claim 8, wherein from the plurality of capacitors and switches, each capacitor is connected in parallel with one switch to form a switched capacitor, and the plurality of switched capacitors are connected in series.

14. The apparatus according to claim 13, wherein the adjustable capacitance is described by the following equation, $$C_{\mathit{eff}} = \frac{1}{\sum_{i=1}^{N} \frac{1-s_i}{C_i}},$$

where $s_i=1$ if switch s is on, and $s_i=0$ if switch s is off.

15. The apparatus according to claim 8, wherein the plurality of switches comprise transistors which are controllable by software.

16. The apparatus according to claim 15, wherein the transistors are n-type metallic oxide semiconductor (NMOS) devices.

17. An apparatus for tuning an inductor, comprising:
   means for adjusting a capacitance value of an adjustable capacitance circuit coupled between an inductor and a ground node in a configuration that calibrates the effective inductance of the inductor in response to changes to the effective capacitance value of the adjustable capacitor such that the combined impedance of the adjustable capacitance circuit and the inductor is tuned to a target inductance value for an inductor in a Radio Frequency (RF) integrated circuit.

18. The apparatus for tuning an inductor according to claim 17, wherein the adjustable capacitance circuit is a tunable capacitor array which includes a plurality of capacitors and switches, further comprising:
   a means for selecting a configuration of the plurality of switches so that the tunable capacitor array is set to the determined capacitance value.

19. An apparatus for tuning an inductor within a matching circuit, comprising:
   a first impedance element placed in an RF signal path;
   a first inductor fabricated on the integrated circuit and connected to the first impedance element; and
   an adjustable capacitance circuit connected in series with the first inductor and placed between the first inductor and a ground node in a configuration that calibrates the effective inductance of the first inductor in response to changes of effective capacitance in the adjustable capacitor circuit, wherein the adjustable capacitance circuit comprises:
      a controller having logic configured to adjust a capacitance value so that the combined impedance of the adjustable capacitance circuit and the inductor is tuned to a target inductance value for an inductor in a Radio Frequency (RF) integrated circuit.

20. The apparatus according to claim 19, wherein the adjustable capacitance circuit further comprises:
   a tunable capacitor array including a plurality of capacitors and switches, and wherein controller includes logic configure to set a configuration of the plurality of switches to adjust the capacitance value.

21. The apparatus according to claim 20, wherein from the plurality of capacitors and switches, each capacitor is connected in series with a switch to form a switched capacitor, and the plurality of switched capacitors are connected in parallel.

22. The apparatus according to claim 20, wherein from the plurality of capacitors and switches, each switch is connected in parallel with at least one capacitor, and wherein the at least one capacitor is connected in series.

23. The apparatus according to claim 20, wherein from the plurality of capacitors and switches, each capacitor is connected in parallel with one switch to form a switched capacitor, and the plurality of switched capacitors are connected in series.

* * * * *